United States Patent [19]
Rudduck et al.

[11] Patent Number: 5,208,599
[45] Date of Patent: May 4, 1993

[54] SERRATED ELECTROMAGNETIC ABSORBER

[75] Inventors: Roger C. Rudduck; Walter D. Burnside; Chang-Fa Yang, all of Columbus, Ohio

[73] Assignee: Ohio State University, Columbus, Ohio

[21] Appl. No.: 751,419

[22] Filed: Aug. 28, 1991

[51] Int. Cl.5 .............................................. H01Q 17/00
[52] U.S. Cl. ........................................... 342/4; 342/1
[58] Field of Search ........................... 342/4, 1, 2, 3

[56] References Cited

U.S. PATENT DOCUMENTS

| | | | |
|---|---|---|---|
| 2,464,006 | 3/1949 | Tiley | 342/4 |
| 2,527,918 | 10/1950 | Collard | 342/2 |
| 2,822,539 | 2/1958 | McMillan | 342/1 |
| 2,870,439 | 1/1959 | Stinehelfer | 342/4 |
| 3,120,641 | 2/1964 | Buckley | 342/4 X |
| 3,234,549 | 2/1966 | McMillan | 342/4 |
| 3,273,150 | 9/1966 | Emerson | 342/4 |
| 3,295,133 | 12/1966 | Emerson et al. | 342/4 |
| 4,164,718 | 8/1979 | Iwasaki | 342/4 X |
| 4,496,950 | 1/1985 | Hemming et al. | 342/4 |
| 4,888,590 | 12/1989 | Chase | 342/3 |
| 4,906,998 | 3/1990 | Shibuya | 342/4 |
| 4,942,402 | 7/1990 | Prewer et al. | 342/1 |

*Primary Examiner*—John B. Sotomayor
*Attorney, Agent, or Firm*—Kevin S. Lemack; William L. Baker

[57] ABSTRACT

Electromagnetic absorber having serrations on a surface or surfaces thereof to reduce reflectivity of incident electromagnetic waves thereon. The serrations form a plurality of fins, the height of adjacent fins being spaced by a small distance. Preferably the total absorber wedge height is greater than about 1 wavelength at the lowest design frequency and the height between the serration tips is less than ¼ wavelength at the lowest design frequency.

20 Claims, 10 Drawing Sheets

5,208,599

SERRATED ELECTROMAGNETIC ABSORBER

BACKGROUND OF THE INVENTION

Electromagnetic wave absorbers and anechoic chambers are in widespread use throughout the world in making antenna and reflectivity measurements. Chambers have been designed as general purpose facilities in order to achieve free space conditions for measuring the characteristics and properties of various components and systems, and are employed for a wide variety of measurements; others have been designed for particular types of measurements such as antenna impedance, gain, beamwidth, circularity, cross polarized component levels, antenna patterns, monostatic and bistatic radar cross-section patterns, system sensitivity, system susceptibility, system compatibility, effective radiated power, boresite alignment, radome error tracking error, etc.

Anechoic chambers provide a standard, reproducible environment which minimizes interfering energy disturbances for the measurement of a wide variety of electrical and electronic devices in order to establish or confirm that they meet certain requirements, such as spurious, harmonic, and noise emissions. However, conventional absorbers, used to cover the walls of indoor ranges for antenna and scattering measurements, for example, limit the performance of these ranges. In order to achieve the desired low reflectivity properties, good absorbers must provide the following two characteristics:

1. a smooth transition from air into the absorber, and
2. complete absorption of the wave inside the absorber. absorber.

Presently available absorber materials typically use homogeneous material cut into either wedges, square pyramids, or cones. The pyramidal-shaped or cone-shaped elements are arranged in the chamber so that they project inwardly into the interior thereof. The absorbers are formed of a low density material that exhibits low dielectric properties and which is coated or impregnated with a substance that inherently absorbs microwave energy. As the microwave energy impinges against the tapered surfaces of the geometrically shaped absorber, part of the energy penetrates into the absorber panel while a part of the energy is reflected. Because of the configuration of the absorber panel, most of the reflected energy is reflected in a direction toward another absorbing surface of the panel rather than being reflected back into the interior of the chamber. Pyramidal and wedge absorbers usually provide better reflectivity performance at microwave frequencies than do flat or planar layers made from multi-layers.

Typically, the component to be evaluated in an anechoic chamber is placed at one end of the chamber facing toward a position at the opposite end from which a microwave energy signal can be beamed toward the device under observation. Although the signal is beamed directly at the device being observed, as the signal leaves the source of energy illumination the energy waves tend to diverge to form a signal of constantly expanding cross-section. The microwave energy absorbing material which lines the side walls, floor and ceiling of the chamber is intended to absorb microwave energy which strays too far from the axis of the signal beam and impinges against these surfaces of the chamber. Ideally, all microwave energy impinged against the absorber material is absorbed so that no wave energy is reflected back into the interior of the chamber to cause interference with the signal beam and inaccuracies in the measurements being taken.

The achievement of the lowest possible level of reflected energy in an anechoic chamber depends upon the proper manipulation of two variables: (a) the characteristics of the absorbing materials used to cover the internal chamber surfaces; and (b) the shaping of the chamber to direct residual reflected energy away from the quiet zone or working volume.

Compact range technology has been significantly improved by using new reflector designs and pulsed radars with large dynamic ranges. However, the scattering from the absorber-coated walls was found to be a serious limitation on compact range performance. Accordingly, several studies were made in an effort to improve absorber performance. Multiple layer wedges were designed (FIG. 1) such that the complex dielectric constant progressively increased from the outer layer through the inner layers. This approach gave better reflectivity than commercially available homogeneous wedge designs because it provided a more gradual transition from air into the absorber. Complete absorption can be achieved by using internal layers with sufficiently high loss. However, the multi-layer approach has the disadvantage that numerous layers are needed to achieve extremely low reflectivity levels.

SUMMARY OF THE INVENTION

The problems of the prior art have been solved by the present invention, which provides absorbers designed to provide better transition from air into the absorber. Absorber means are provided which applies dual impedance matching to absorb incident waves. Specifically, serrations, regularly or randomly spaced, are provided on the surfaces of wedges, pyramids, cones, or other shaped absorbers with either multiple or uniform dopings to improve the impedance matching between free space and the absorber. The serration layer reduces the reflection of the incident electromagnetic waves from the absorber.

DETAILED DESCRIPTION OF THE INVENTION

In broad terms, the instant serration concept achieves good results with dimensions within the bounds such that the total wedge height is greater than about one wavelength at the lowest frequency and the height between serrations tips is less than ¼ wavelength at the lowest frequency.

Figure 1:
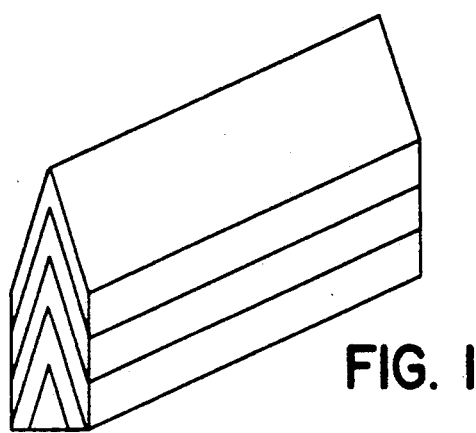
FIG. 1 is a perspective view of an absorber having a multilayer wedge design.
Figure 1A:
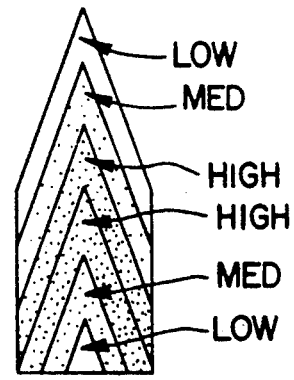
FIG. 1a is an end view of the absorber of FIG. 1.
Figure 2:
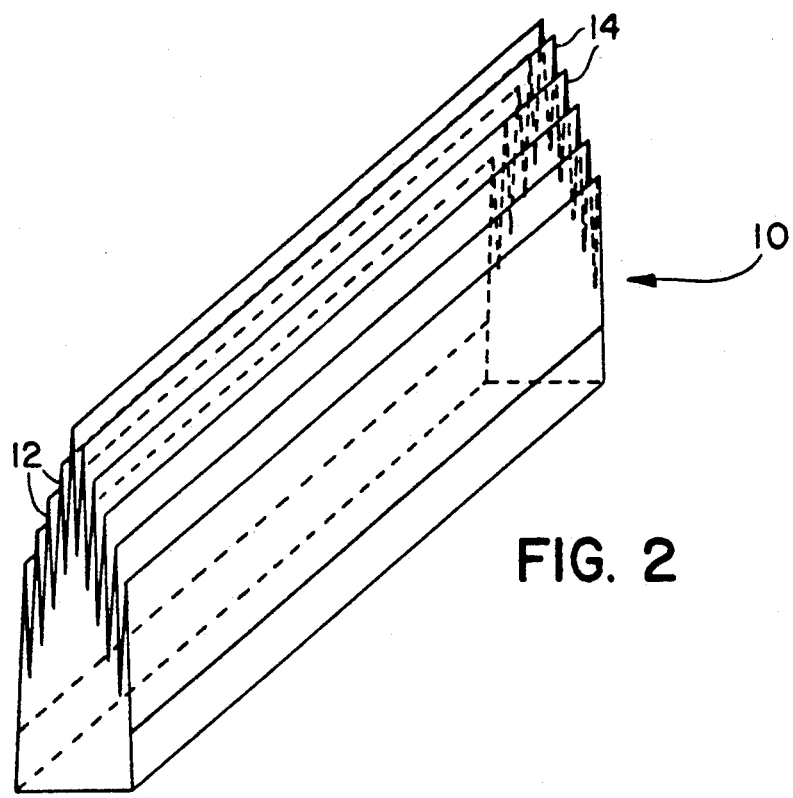
FIG. 2 is a perspective view of one embodiment of a serrated absorber in accordance with the present invention.
Figure 2A:
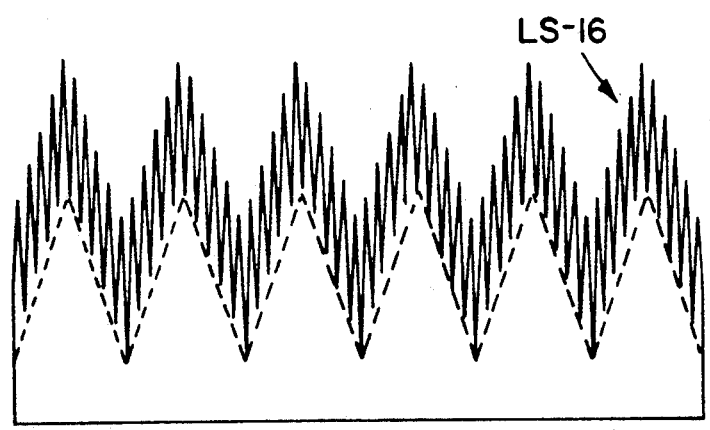
FIG. 2a is a front view of the absorber of FIG. 2.

Turning now to FIGS. 2 and 2a, illustrated is one embodiment of the present invention in which a wedge-shaped absorber shown generally at 10 is formed of LS-16 (available commercially from Emerson & Cuming, Inc. of W. R. Grace & Co.-Conn.) material having a series of serrations 12 along its surface. The individual wedge has a height of about 2.1 freespace wavelengths (references to freespace wavelengths are to be construed as freespace wavelengths at the lowest design frequency) and a width of about 0.7 freespace wavelengths. For the example found in FIGS. 2 and 2a, the 2.1 and 0.7 freespace wavelengths translate to dimensions of 12.6 and 4 inches for the low frequency design limit of 2.0 GHz. As shown in FIG. 2a by way of illustration, each wedge in the six wedge design is formed with ten serrations each having a height of 0.68 freespace wavelengths or 4 inches for the low frequency design limit of 2.0 GHz. That is, the depth of each cut made in the wedge surface is about 0.7 freespace wavelengths, (corresponding to four inches at 2.0 GHz); the total height of the wedge with serrations is about 2.13 freespace wavelengths (corresponding to 12.6 inches at 2.0 GHz); the difference in height between adjacent serrations is about 0.2 freespace wavelengths (corresponding to 1.2 inches at 2.0 GHz), etc. (FIG. 2a). Fins 14 are formed by the serrations, and are shaped so as to taper towards their upper surface. Preferably the height of adjacent fins formed by the serrations on one side of the wedge relative to the other should be shifted about 0.1 freespace wavelengths, or 0.6 inches (see FIG. 2a), which the present inventors have found further improves the scattering performance of the absorber for the frequency band of interest, 2 to 18 GHz. The wedge design exhibits a good transition over a broad band of frequencies while achieving sufficient absorption with relatively small heights.

The embodiment illustrated in FIGS. 2 and 2a was designed for the 2-18 GHz frequency band. Designs based on using serrations can be made for other frequency bands by changing the physical dimensions of the absorber, and by controlling the raw material to have the appropriate dielectric properties within the frequency band of its use.

In general, the serrations can be formed by any suitable means, such as by cutting from the absorber surface, by attaching fins 14 to the absorber surface, or by molding fins 14 onto the surface. Preferably the serrations are made by computer aided cutting in order to maintain the precision needed for this new shape.

Figure 3:
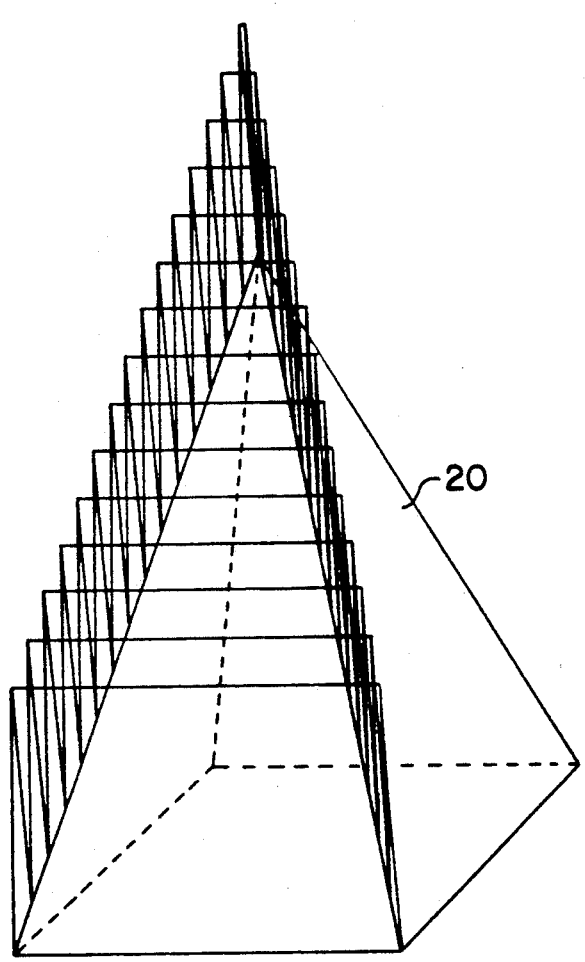
FIG. 3 is an oblique view of one embodiment of a serrated absorber in accordance with the present invention.
Figure 3A:
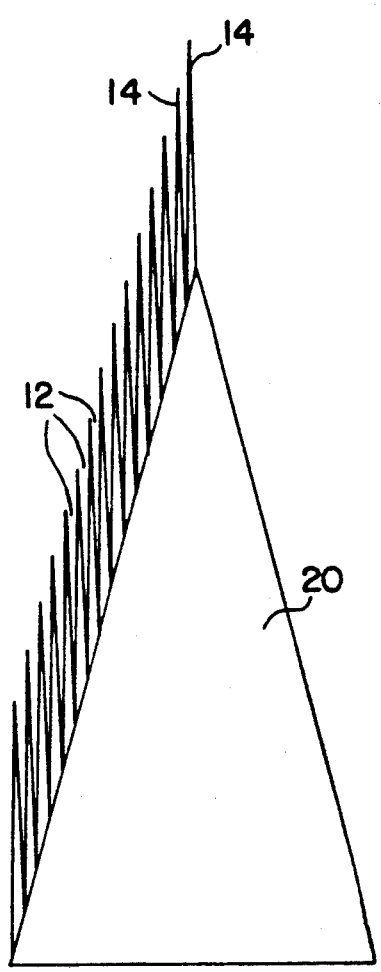
FIG. 3a is a side view of the absorber of FIG. 3.
Figure 4:
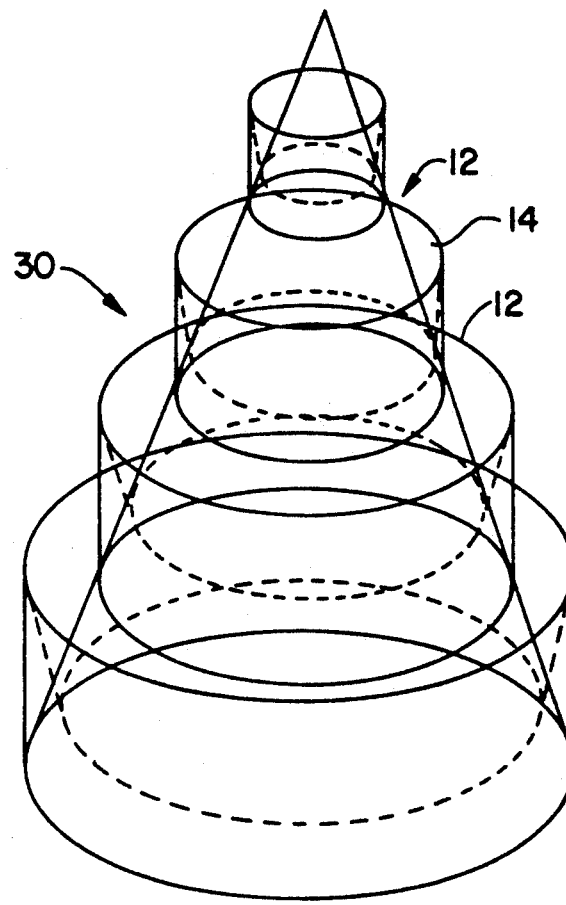
FIG. 4 is an oblique view of one embodiment of a serrated absorber in accordance with the present invention.
Figure 4A:
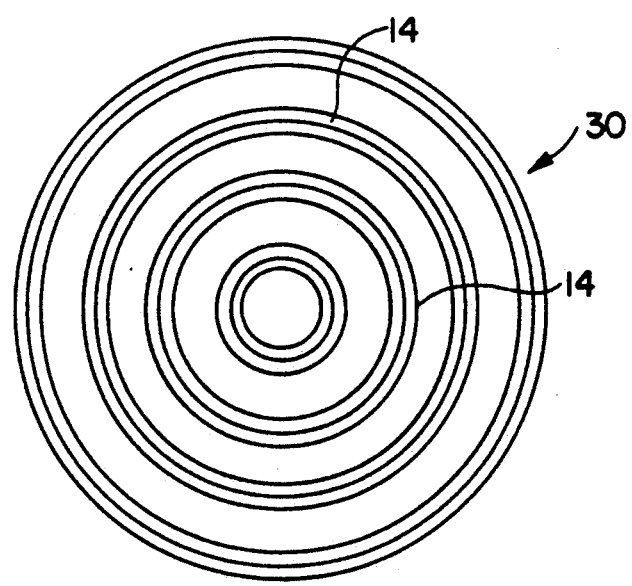
FIG. 4a is a top view of the absorber of FIG. 4.

FIGS. 3 and 3a illustrate a pyramidal-shaped absorber 20 with serrations 12 along its surface (only one face shown with serrations). FIGS. 4 and 4a illustrate a cone-shaped absorber 30 having serrations 12 along its surface.

Figure 5:
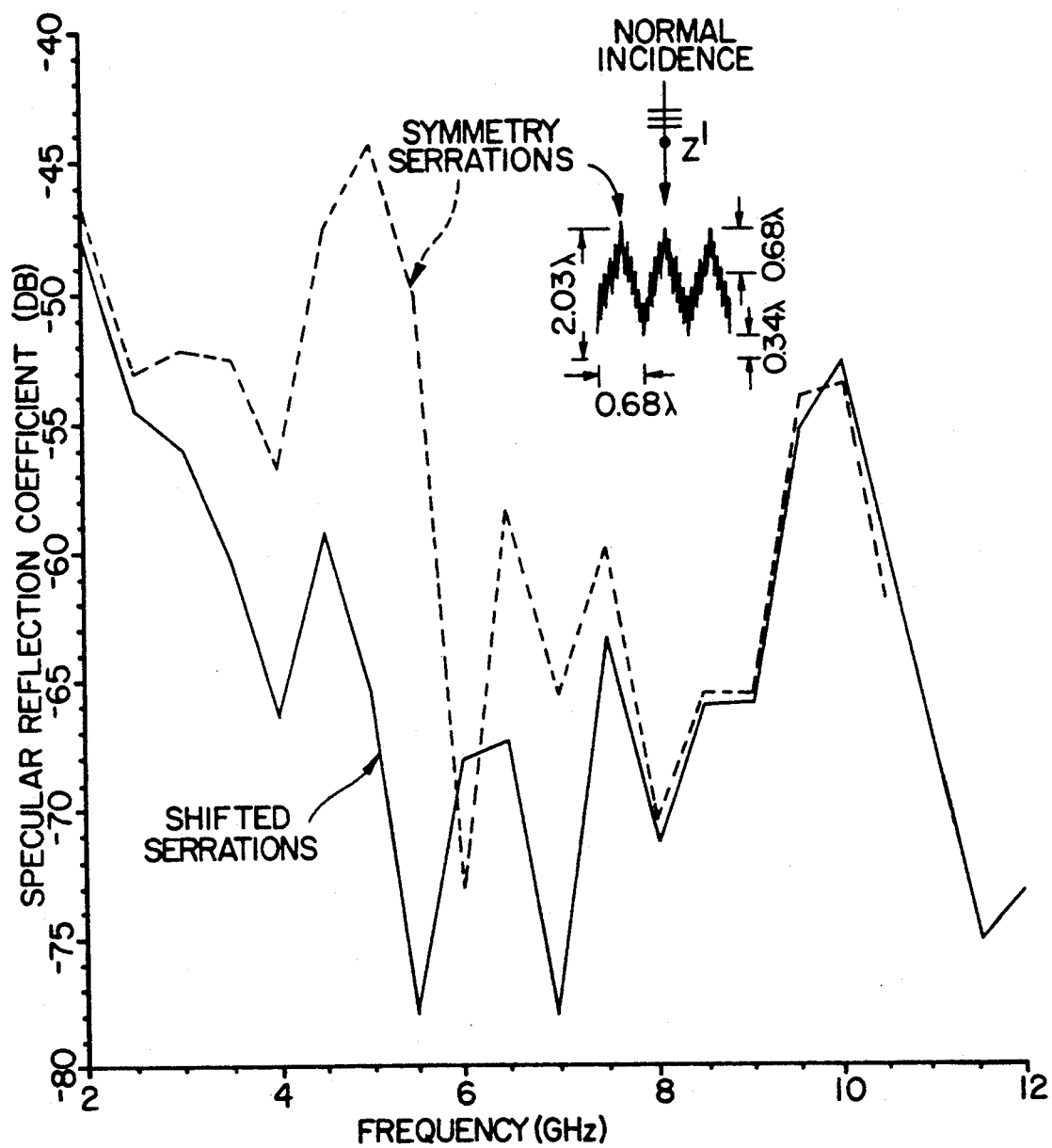
FIG. 5 is a graphical comparison of the serrated wedge designs with and without the preferred shift in serrations.

FIG. 5 is a graphical illustration of reflectivity demonstrating the improved performance achieved by forming the absorber with serrations such that the resulting fins are shifted from each other in height by about 0.1 freespace wavelengths or 0.6 inches, for this case. At almost all frequencies, a wedge design having symmetrical serrations exhibits a higher specular reflection coefficient than a wedge having serrations such that the fins are shifted by a small distance, such as about 0.1 freespace wavelengths or about 0.6 inches for the example depicted in FIG. 5. The graph demonstrates the versatility of the instant invention in its capability of arranging the positions of the serrations depending upon the desired characteristics for the absorber.

The principle for shifting the heights of the serrations is to avoid symmetry in the resulting fins. The recommended amount of shift in the serrations is such to cause the heights of the fins on one side of a wedge to lie midway between the heights of the fins on the other side of the wedge.

Figure 6:
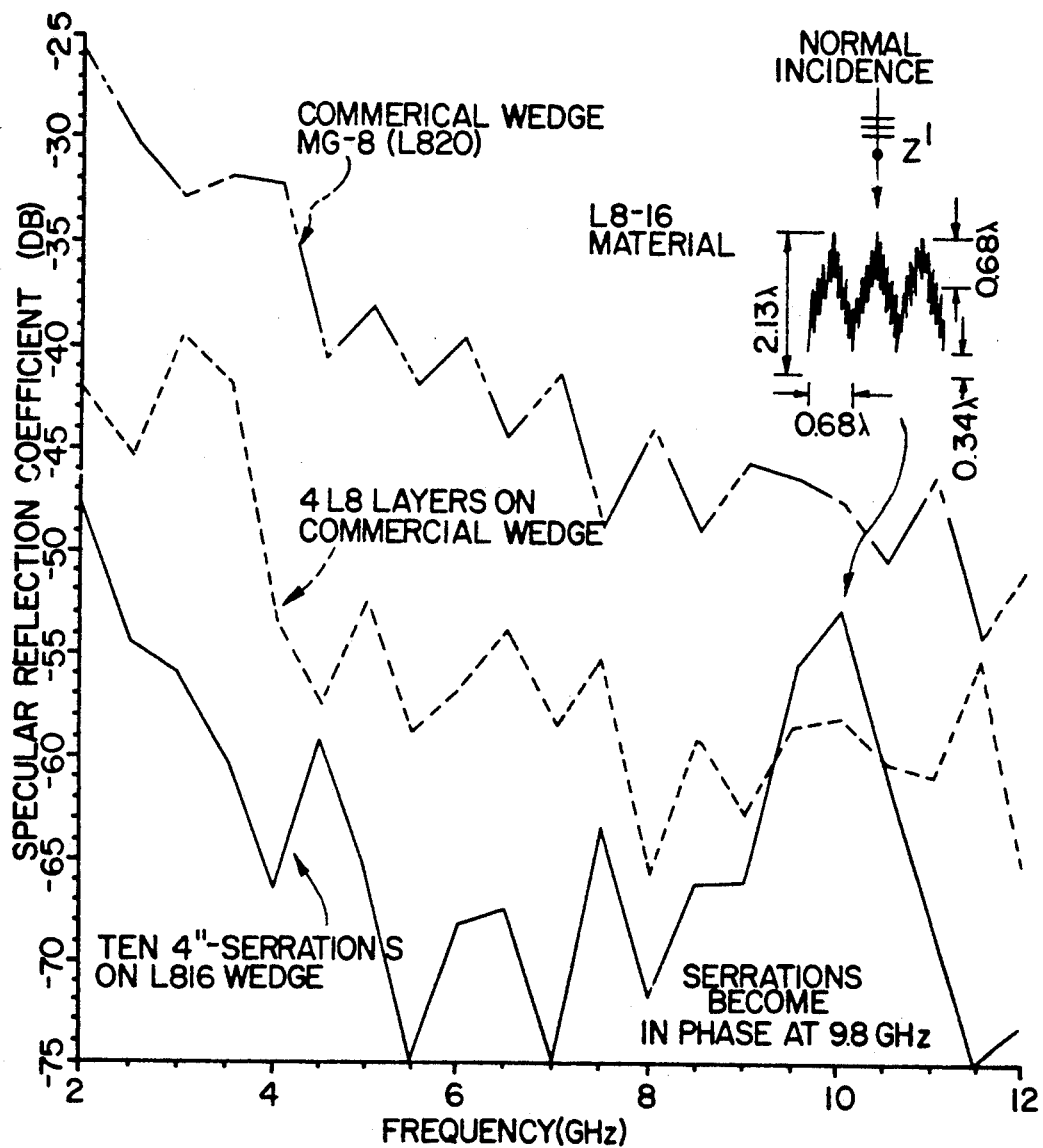
FIG. 6 is a graphical comparison of an absorber in accordance with the present invention and prior art absorbers.
Figure 7:
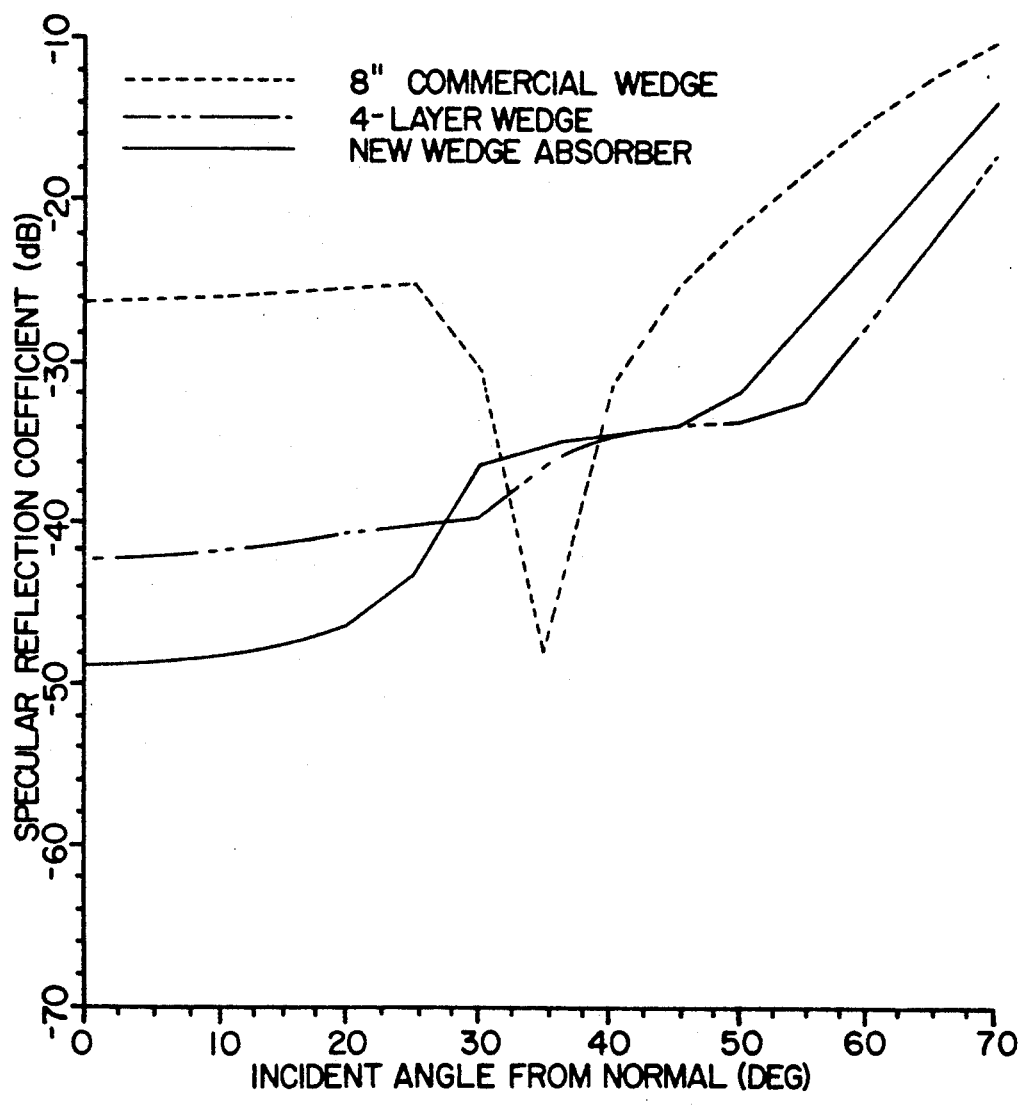
FIG. 7 is a graphical comparison of an absorber in accordance with the present invention and prior art absorbers at a fixed frequency of 2 GHz.
Figure 8:
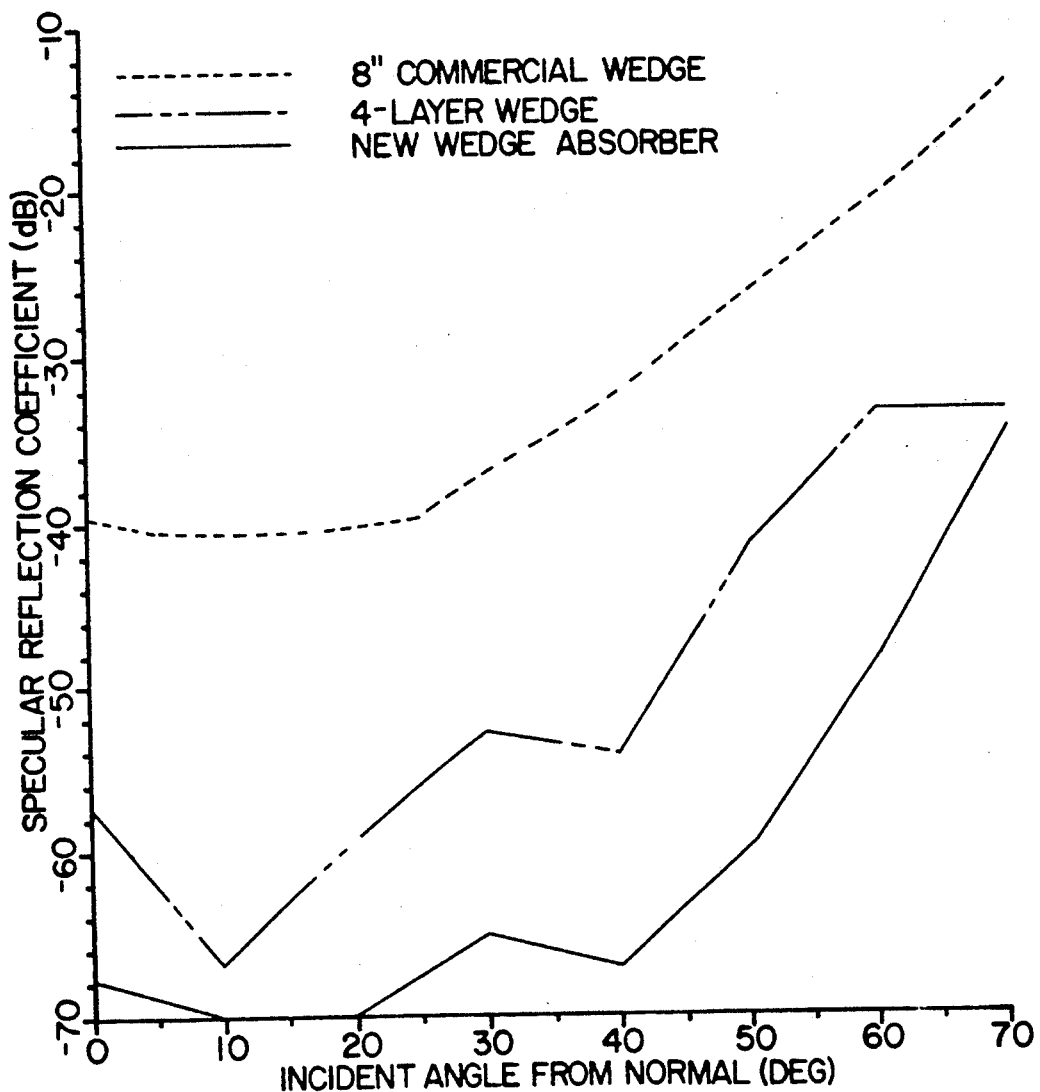
FIG. 8 is a graphical comparison of an absorber in accordance with the present invention and prior art absorbers at a fixed frequency of 6 GHz.
Figure 9:
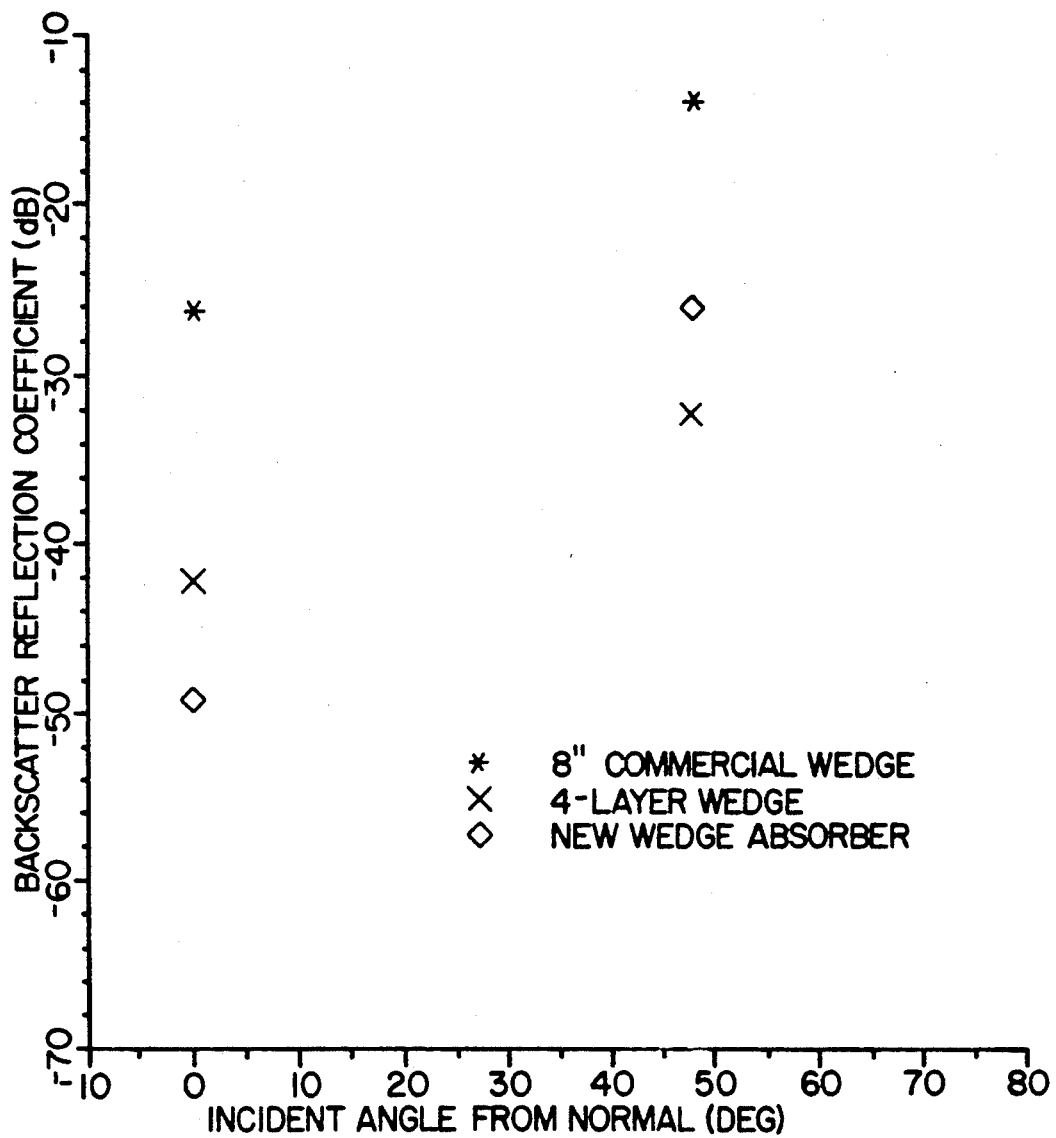
FIG. 9 is a graphical comparison of the backscatter of an absorber in accordance with the present invention and prior art absorbers at a fixed frequency of 2 GHz.
Figure 10:
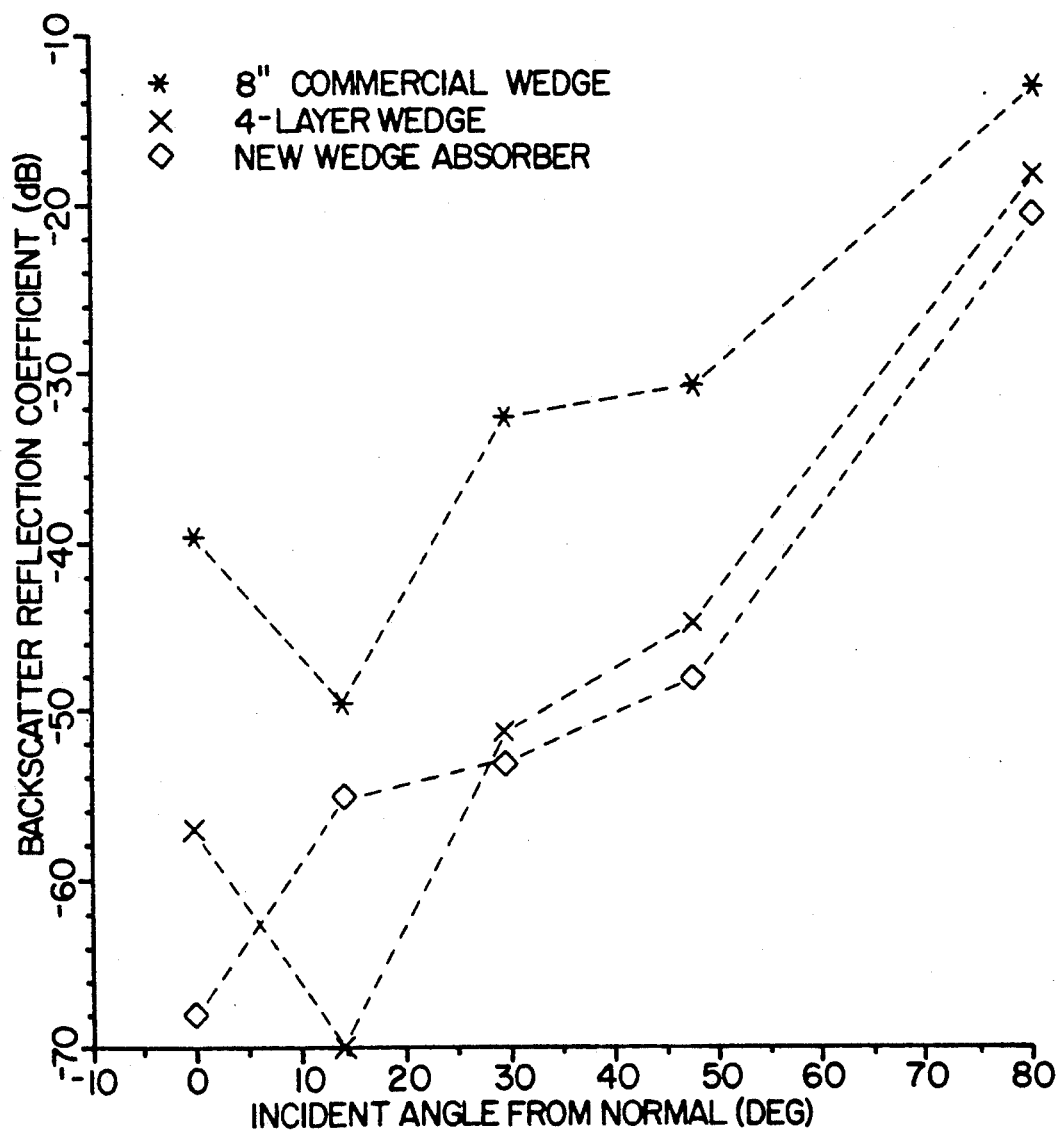
FIG. 10 is a graphical comparison of the backscatter of an absorber in accordance with the present invention and prior art absorbers at a fixed frequency of 6 GHz.

The calculated reflectivity performances of several absorbers are plotted in FIGS. 6-10, with FIGS. 6-8 showing specular scatter and FIGS. 9 and 10 showing backscatter. From these data it can be seen that the serrated wedge design having ten 4-inch serrations (about 0.7 freespace wavelengths) on a wedge with LS-16 dielectric properties provides much better performance than conventional WG-8 (available commercially from Emerson & Cuming, Inc. of W. R. Grace & Co.-Conn.) wedges, and indeed, better performance in general than a 4 LS layer design. The performance of this serrated wedge design in accordance with the present invention is comparable to a good 8-layer design. However, the 8-layer design would require careful quality control in terms of achieving accurate levels of doping for each layer, whereas the doping level for the serrated wedge design is not critical. In addition, the multi-layer design requires adhesive between layers, whereas the instant serrated design can be cut from a single block of uniformly doped foam.

The use of the absorber in accordance with the present invention to cover the surfaces of indoor ranges, for example, results in very high absorption of electromagnetic signals, thereby significantly improving the performance of the ranges. In addition, smaller ranges can be constructed having efficiencies that could only previously be achieved by larger ranges. Existing ranges can be retrofitted with this absorber as well.

The serrations can be applied to any absorber with either multiple or uniform doping. Any kind of serrations, regularly or randomly spaced, can be used on the surfaces of the absorber, so long as dual impedance matching to absorb incident waves is achieved. One matching comes from the shaping of the whole absorber (i.e., wedges, pyramids, cones, etc.) which may be inhomogeneous, and the other matching is provided by the shaping of the absorber surfaces into any form of serration or cutting.

What is claimed is:

1. An electromagnetic absorber having a geometrical configuration comprising a plurality of surfaces, at least one of said surfaces having formed thereon a plurality of serrations defining a plurality of fins projecting from said at least one surface, the difference in height between adjacent fins being less than ¼ freespace wavelengths at the lowest design frequency for reducing the reflection of incident electromagnetic waves from said absorber.

2. The electromagnetic absorber of claim 1, wherein said geometrical configuration is selected from the group consisting of pyramidal, conical and wedge.

3. The electromagnetic absorber of claim 1, wherein said serrations form asymmetrical fins.

4. The electromagnetic absorber of claim 1, wherein said serrations cause the heights of said fins on one surface of said absorber to lie midway between the heights of the fins on another surface of said absorber.

5. The electromagnetic absorber of claim 1, wherein the absorber is non-uniformly doped.

6. An anechoic chamber for providing an environment simulating that of freespace, wherein the interior surfaces of said chamber are lined with a plurality of electromagnetic absorbers each having a geometrical configuration comprising a plurality of surfaces, at least one of said surfaces having formed thereon a plurality of serrations defining a plurality of fins projecting from said at least one surface, the difference in height between adjacent fins being less than ¼ freespace wavelengths at the lowest design frequency for reducing the reflection of incident electromagnetic waves from said absorber.

7. The anechoic chamber of claim 6, wherein said absorbers have geometrical configurations selected from the group consisting of pyramidal, conical and wedge.

8. The anechoic chamber of claim 6, wherein said serrations are asymmetrical.

9. The anechoic chamber of claim 6, wherein said serrations cause the heights of said fins on one surface of said absorber to lie midway between the heights of the fins on another surface of said absorber.

10. The anechoic chamber of claim 6, wherein at least some of said absorbers are non-uniformly doped.

11. A method of reducing the reflectivity of incident electromagnetic waves on an electromagnetic absorber, comprising providing a plurality of serrations on at least one surface of said absorber such that said serrations define a plurality of fins projecting from said at least one surface, the difference in height between adjacent fins being less than ¼ freespace wavelengths at the lowest design frequency.

12. The method of claim 11, wherein said serrations cause the heights of said fins on one surface of said absorber to lie midway between the heights of the fins on another surface of said absorber.

13. The electromagnetic absorber of claim 1, wherein said difference in height between adjacent substrates is about 0.2 freespace wavelengths at the lowest design frequency.

14. The electromagnetic absorber of claim 1 having a total height of greater than about 1 freespace wavelength at the lowest design frequency.

15. The electromagnetic absorber of claim 14, wherein said total height is about 2.1 freespace wavelengths at the lowest design frequency.

16. The electromagnetic absorber of claim 1, wherein said absorber has a width of about 0.7 freespace wavelengths at the lowest design frequency.

17. The anechoic chamber of claim 6, wherein said difference in height between adjacent substrates is about 0.2 freespace wavelengths at the lowest design frequency.

18. The anechoic chamber of claim 6, wherein said absorbers each have a total height of greater than about 1 freespace wavelength at the lowest design frequency.

19. The anechoic chamber of claim 18, wherein said total height is about 2.1 freespace wavelengths at the lowest design frequency.

20. The anechoic chamber of claim 6, wherein said absorber has a width of about 0.7 freespace wavelengths at the lowest design frequency.

* * * * *